US008306108B2

(12) United States Patent
Lu et al.

(10) Patent No.: US 8,306,108 B2
(45) Date of Patent: Nov. 6, 2012

(54) ADAPTIVE CANONICAL HUFFMAN DECODER AND METHOD THEREOF AND VIDEO DECODER

(75) Inventors: Ying-Hung Lu, Kaohsiung County (TW); Chao-Tsung Huang, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 615 days.

(21) Appl. No.: 12/553,994

(22) Filed: Sep. 4, 2009

(65) Prior Publication Data
US 2010/0195739 A1 Aug. 5, 2010

(30) Foreign Application Priority Data

Feb. 4, 2009 (TW) ............................... 98103502 A

(51) Int. Cl.
*H04B 1/66* (2006.01)
*H04N 7/12* (2006.01)
*H04N 11/02* (2006.01)
*H04N 11/04* (2006.01)

(52) U.S. Cl. ................................. 375/240.02
(58) Field of Classification Search ........................ None
See application file for complete search history.

(56) References Cited

U.S. PATENT DOCUMENTS

| | | | | |
|---|---|---|---|---|
| 5,173,695 A | | 12/1992 | Sun et al. | |
| 5,528,628 A | * | 6/1996 | Park et al. | 375/240 |
| 5,568,140 A | * | 10/1996 | Imanishi et al. | 341/67 |
| 5,764,658 A | * | 6/1998 | Sekiguchi et al. | 714/752 |
| 5,781,227 A | * | 7/1998 | Goode et al. | 725/32 |
| 5,828,425 A | * | 10/1998 | Kim | 375/240.26 |
| 5,973,744 A | * | 10/1999 | Kim | 375/240.24 |
| 6,140,945 A | * | 10/2000 | Yokose | 341/65 |
| 6,657,569 B2 | | 12/2003 | Barnett | |
| 6,812,863 B2 | * | 11/2004 | Hagiwara | 341/50 |
| 6,937,170 B2 | * | 8/2005 | Otsuka | 341/67 |
| 7,924,180 B2 | * | 4/2011 | Chang | 341/67 |
| 2002/0090142 A1 | * | 7/2002 | Igarashi et al. | 382/246 |
| 2002/0154042 A1 | * | 10/2002 | Igarashi et al. | 341/67 |
| 2003/0006918 A1 | * | 1/2003 | Barnett | 341/67 |
| 2004/0081241 A1 | * | 4/2004 | Kadono et al. | 375/240.23 |
| 2004/0179820 A1 | * | 9/2004 | Kashiwagi et al. | 386/95 |
| 2004/0196167 A1 | * | 10/2004 | Otsuka | 341/67 |
| 2005/0226518 A1 | * | 10/2005 | Suzuki et al. | 382/246 |
| 2005/0232504 A1 | * | 10/2005 | Suzuki et al. | 382/246 |
| 2006/0087585 A1 | * | 4/2006 | Seo et al. | 348/385.1 |
| 2006/0214822 A1 | * | 9/2006 | Mitchell et al. | 341/50 |
| 2007/0230802 A1 | * | 10/2007 | Kato et al. | 382/233 |
| 2008/0095453 A1 | * | 4/2008 | Suzuki et al. | 382/246 |
| 2008/0122664 A1 | * | 5/2008 | Chang et al. | 341/65 |
| 2009/0251341 A1 | * | 10/2009 | Chang | 341/65 |
| 2010/0079315 A1 | * | 4/2010 | Chang | 341/67 |

* cited by examiner

*Primary Examiner* — Phirin Sam
*Assistant Examiner* — Peter Chau
(74) *Attorney, Agent, or Firm* — Jianq Chyun IP Office

(57) ABSTRACT

An adaptive canonical Huffman decoder including a symbol index generator, a content selector, and a symbol table buffer circuit is illustrated. The content selector outputs a content selection signal. The symbol table buffer circuit reads a corresponding symbol table from a plurality of symbol tables stored in an external memory according to the content selection signal and stores the corresponding symbol table. The symbol index generator stores decoding information of a plurality of encoding tables and selects a corresponding decoding information among all the decoding information according to the content selection signal. Then, the symbol index generator receives a bit stream and decodes the bit stream according to the corresponding decoding information to obtain a symbol index. After that, the symbol table buffer circuit obtains an output symbol from the corresponding symbol table according to the symbol index.

16 Claims, 8 Drawing Sheets

ADAPTIVE CANONICAL HUFFMAN DECODER AND METHOD THEREOF AND VIDEO DECODER

CROSS-REFERENCE TO RELATED APPLICATION

This application claims the priority benefit of Taiwan application serial no. 98103502, filed Feb. 4, 2009. The entirety of the above-mentioned patent application is hereby incorporated by reference herein and made a part of specification.

BACKGROUND OF THE INVENTION

1. Field of the Invention

The present invention generally relates to an entropy decoder, and more particularly, to an adaptive canonical Huffman decoder and a method thereof, and a video decoder using the adaptive canonical Huffman decoder and the method thereof.

2. Description of Related Art

Huffman coding is an entropy coding usually applied to image or video compression, and which is a long-standing lossless compression technique. However, if Huffman coding is adopted, a decoder has to know the structure of a Huffman coding tree, and accordingly the encoder has to transmit a Huffman coding tree to the decoder in a bit stream, or the decoder has to use a Huffman coding tree pre-established between the decoder and an encoder.

However, the quantity of data to be compressed has been increasing along with the development of information technology. Thus, the data compression rate will be drastically reduced if a Huffman coding tree is transmitted in a bit stream. Even though this problem can be resolved by storing the Huffman coding tree in the decoder in advance, too much hardware resource of the decoder will be taken up by the large Huffman coding tree.

In order to resolve foregoing problem, a canonical Huffman coding concept is brought forward by Schwartz (1964). Same as Huffman coding, the canonical Huffman coding also belongs to the optimal prefix coding and the variable length coding. The canonical Huffman coding is a subset of the Huffman coding, and the major feature thereof is that some compulsory assumptions are added into the Huffman coding such that a decoder can re-construct an entire Huffman coding tree with very little information.

The most important assumption of canonical Huffman coding is the assumption of a numerical sequence property. This assumption specifies that all the codewords having the same length are continuous binary digits. For example, if a first code having a codeword length of 4 is 0010, the other codewords having a codeword length of 4 must be 0011, 0100, 0101, etc. Besides this assumption of numerical sequence property, other assumptions are also specified in the canonical Huffman coding. Canonical Huffman coding is divided into a first type of canonical Huffman coding and a second type of canonical Huffman coding according to these assumptions.

The conventional canonical Huffman coding usually adopts a software decoding method. However, the codeword lengths are determined sequentially in the software decoding method. As a result, when the codeword lengths are large, the software decoding method may not be efficient enough to be applied to some systems (for example, real-time systems) with higher speed requirement.

In the U.S. Pat. No. 5,173,695, a hardware decoder is provided by Ming-Ting Sun for decoding a variable length code. Since canonical Huffman coding is also a variable length coding, the hardware decoder may also be applied to the decoding of canonical Huffman codes. FIG. 1A is a schematic block diagram of a canonical Huffman decoder 10 implemented according to the U.S. Pat. No. 5,173,695. Referring to FIG. 1A, the conventional decoder 10 includes registers 101 and 102, a barrel register 103, an adder 104, and a lookup table 11. The lookup table 11 includes a codeword table 110, a decoded symbol table 111, and a codeword length table 112. The coupling relationship between foregoing components of the canonical Huffman decoder 10 is as shown in FIG. 1A and therefore will not be described herein.

The conventional decoder 10 compares an input bit stream with the codeword table 110 in parallel and outputs the obtained codeword lengths and decoded symbols. The codeword table 110, the codeword length table 112, and the decoded symbol table 111 are all stored in a programmable logic array. Thus, the decoding speed of the conventional decoder 10 is very fast. The conventional decoder 10 can decode one symbol during each clock cycle (1 symbol/cycle) and accordingly can meet the requirement of many real-time systems.

However, along with the advancement of encoding algorithm, a content adaptive concept is brought forward. According to the content adaptive concept, the probability distributions of different symbols are different in different encoding environments. Thus, an encoder uses different encoding tables for encoding a code in different environments. As a result, the decoder has to use the corresponding encoding table for decoding the code. For example, in the VC-1 specification, there are totally 8 alternating current (AC) encoding tables, and which AC encoding table is used for encoding a code is determined according to a quantization parameter (QP), an inter-frame difference, or an intra-frame difference.

Many recent video encoding standards (for example, H.264 and VC-1) adopt this content adaptive concept. If a content adaptive decoder is to be implemented according to the concept provided by the U.S. Pat. No. 5,173,695, an encoding table selection signal and two multiplexers have to be added to select a correct decoded symbol.

FIG. 1B is a schematic block diagram of a content adaptive decoder 20 implemented according to the U.S. Pat. No. 5,173,695. Referring to FIG. 1B, the decoder 20 includes registers 201 and 202, a barrel register 203, an adder 204, a first lookup table 21, a second lookup table 22, a third lookup table 23, a fourth lookup table 24, and multiplexers 205 and 206. The first through the fourth lookup tables 21~24 store the contents of corresponding encoding tables. For example, the first lookup table 21 stores the codeword table, decoded symbol table and codeword length table in the corresponding encoding table. The coupling relationship between foregoing components of the decoder 20 is as shown in FIG. 1B and therefore will not be described herein.

The decoder 20 compares an input bit stream with a programmable logic array in parallel. Each of the lookup tables 21~24 outputs a decoded symbol and a codeword length, and an encoding table selection signal Table_sel is used for controlling the multiplexers 205 and 206 to select a correct decoded symbol and codeword length. However, the hardware cost of this implementation increases in proportion along with the increase of encoding tables. Even though this implementation can be applied to all variable length decoding and is easy to realize, the hardware cost thereof when applied to content adaptive coding is drastically increased.

Even though the decoder provided by U.S. Pat. No. 5,173, 695 offers a high decoding speed and is easy to implement, and which may even be implemented as any variable length decoder, because the implementation of a canonical Huffman decoder does not benefit from the feature of canonical Huffman coding that it is not necessary to store an entire Huffman coding tree, the hardware cost will be much high to implement a canonical Huffman decoder according to the U.S. Pat. No. 5,173,695.

Accordingly, a canonical Huffman decoder is provided in U.S. Pat. No. 6,657,569 by Mark L. Barnett, wherein which the decoding speed is increased by using the hardware acceleration manner. FIG. 2 is a schematic block diagram of a canonical Huffman decoder 30 according to the U.S. Pat. No. 6,657,569. Referring to FIG. 2, the canonical Huffman decoder 30 includes a first code register 301, a symbol pointer register 302, comparators 330~33N, subtractors 350~35N, adders 340~34N, and a multiplexer 312. The coupling relationship between foregoing components of the canonical Huffman decoder 30 is as shown in FIG. 2 and therefore will not be described herein.

An external memory records a plurality of different encoding tables, and each of the encoding tables has a corresponding first code table, symbol pointer table, and symbol table. The first code register 301 selects a first code table corresponding to the current encoding table from a plurality of first code tables stored in the external memory, wherein the selected first code table records first codes FIRSTCODE[0] ~FIRSTCODE[N] having their codeword lengths from 1 to N+1. The symbol pointer register 302 selects a symbol pointer table corresponding to the current encoding table from a plurality of symbol pointer tables stored in the external memory. The symbol pointer register 302 only stores the symbol pointers SYM_PTR[0]~SYM_PTR[N] of a plurality of first codes corresponding to the first code register 301, wherein SYM_PTR[i] represents the symbol pointer of a first code having a codeword length of i+1, wherein i is an integer between 0 and N.

The canonical Huffman decoder 30 compares all the first codes with an input bit stream according to the feature of canonical Huffman coding and then selects a correct codeword length and address signal by using the multiplexer 312. Finally, the canonical Huffman decoder 30 obtains a correct decoded symbol from the external memory according to the address signal.

Because both the input and output of the canonical Huffman decoder 30 need to access the external memory, in a system using the canonical Huffman decoder 30, the rights of all memory accesses is determined through the arbitration of an arbiter. As a result, the canonical Huffman decoder 30 has a low decoding speed. Thus, the canonical Huffman decoder 30 may not be able to meet the speed requirement of some real-time systems. In addition, the canonical Huffman decoder 30 can only decode second type of canonical Huffman codes, and when the canonical Huffman decoder 30 is applied to a video decoder, the decoding information of a corresponding encoding table is always updated after a frame is decoded in consideration of the decoding speed. Thereby, the canonical Huffman decoder 30 is not very adaptable in its application.

SUMMARY OF THE INVENTION

According to an exemplary embodiment of the present invention, an adaptive canonical Huffman decoder including a symbol index generator, a content selector, and a symbol table buffer circuit is provided. The content selector is coupled to the symbol index generator, and the symbol table buffer circuit is coupled to the symbol index generator and the content selector. The content selector outputs a content selection signal. The symbol index generator stores decoding information of a plurality of encoding tables and selects a corresponding decoding information from all the decoding information according to the content selection signal. The symbol table buffer circuit reads a corresponding symbol table among a plurality of symbol tables stored in an external memory according to the content selection signal and stores the corresponding symbol table. Then, the symbol index generator receives a bit stream and decodes the bit stream according to the corresponding decoding information to obtain a symbol index. Next, the symbol table buffer circuit obtains an output symbol from the corresponding symbol table according to the symbol index.

According to an exemplary embodiment of the present invention, a video decoder including an adaptive canonical Huffman decoder and a decoding controller is provided. The adaptive canonical Huffman decoder includes a symbol index generator, a content selector, and a symbol table buffer circuit. The content selector is coupled to the symbol index generator, the symbol table buffer circuit is coupled to the symbol index generator and the content selector, and the decoding controller is coupled to the symbol index generator and the symbol table buffer circuit. The content selector outputs a content selection signal. The symbol index generator stores decoding information of a plurality of encoding tables and selects a corresponding decoding information from all the decoding information according to the content selection signal. The symbol index generator further receives a bit stream and decodes the bit stream according to the corresponding decoding information to obtain a symbol index. The symbol table buffer circuit reads a corresponding symbol table among a plurality of symbol tables stored in an external memory according to the content selection signal, stores the corresponding symbol table, and obtains an output symbol from the corresponding symbol table according to the symbol index. The decoding controller controls the symbol index generator and the symbol table buffer circuit.

According to an exemplary embodiment of the present invention, an adaptive canonical Huffman decoding method is provided. First, a first cache space is provided for storing decoding information of a plurality of encoding tables. Then, a corresponding decoding information is selected from all the decoding information according to a content selection signal. Next, a corresponding symbol table is selected among a plurality of symbol tables stored in an external memory according to the content selection signal, and the corresponding symbol table is stored into a second cache space. After that, a bit stream is received and decoded according to the corresponding decoding information to obtain a symbol index. Next, an output symbol is obtained from the corresponding symbol table according to the symbol index.

As described above, compared to the conventional adaptive canonical Huffman decoder, adaptive canonical Huffman decoding method, and video decoder, the adaptive canonical Huffman decoder, adaptive canonical Huffman decoding method, and video decoder provided by the exemplary embodiments of present invention are more adaptable and can meet the speed requirement of many real-time systems. Moreover, according to the exemplary embodiments the present invention, the corresponding decoding information of an appropriate encoding table is used for decoding a code according to a content selection signal, and the hardware cost will not be increased when the number of encoding tables increases.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
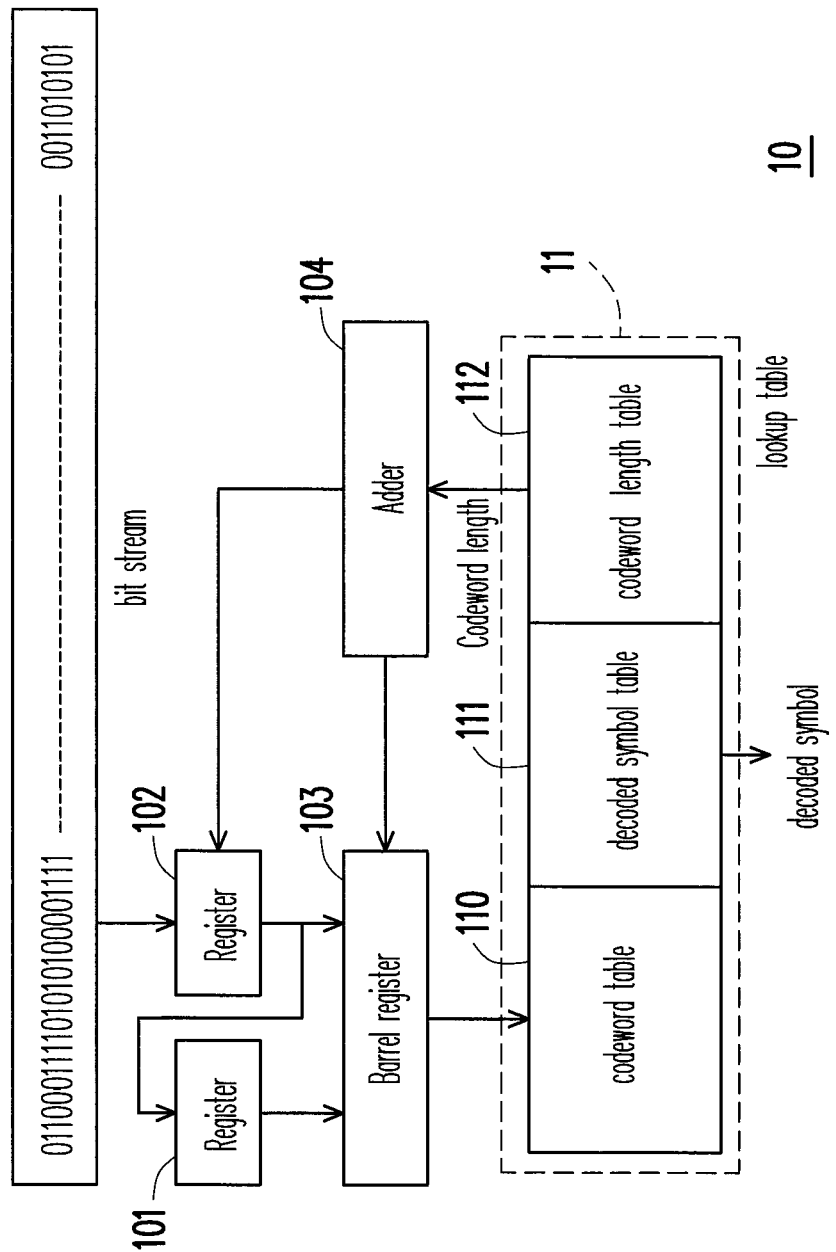
FIG. 1A is a schematic block diagram of a canonical Huffman decoder 10 according to U.S. Pat. No. 5,173,695.
Figure 1B:
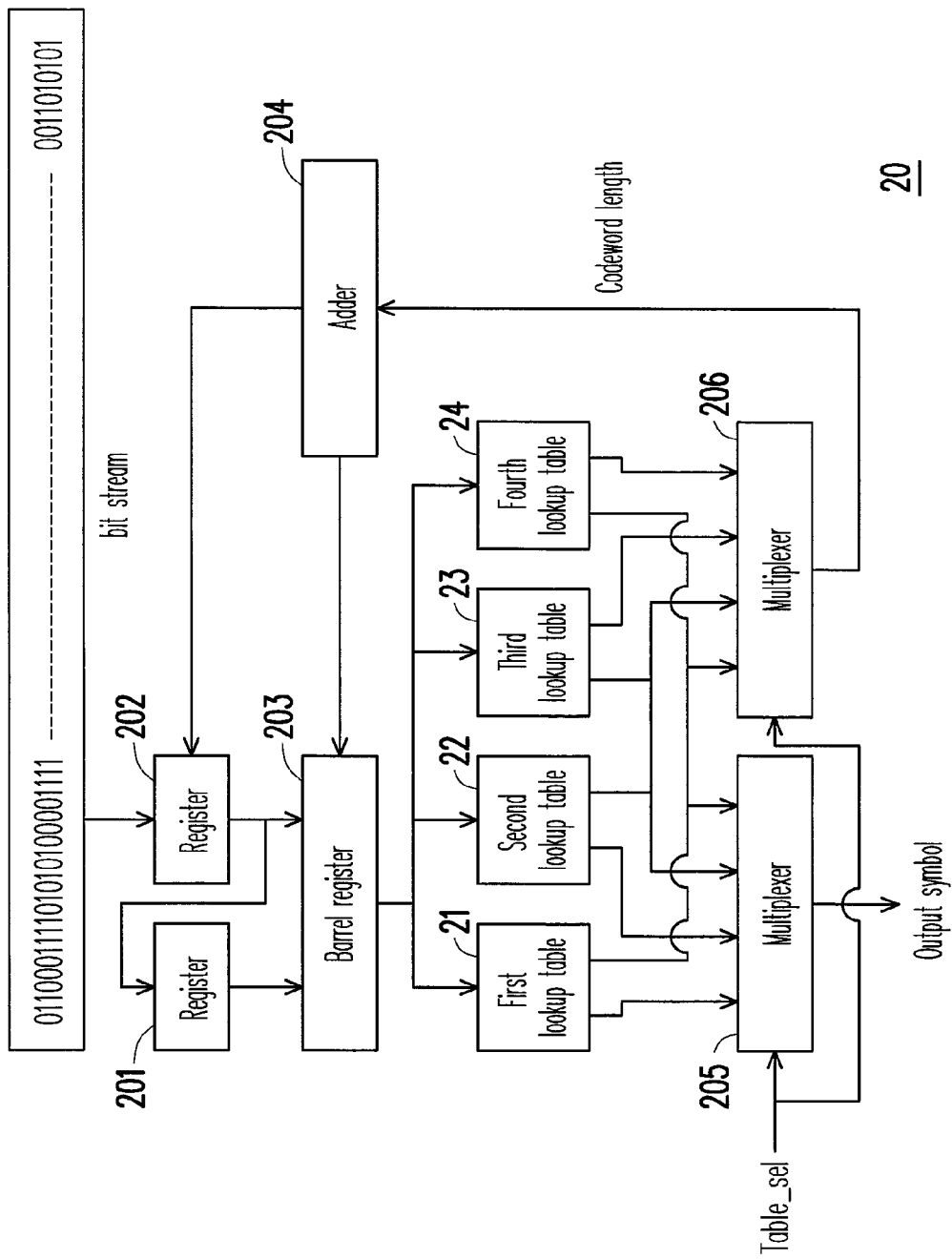
FIG. 1B is a schematic block diagram of a content adaptive decoder 20 according to U.S. Pat. No. 5,173,695.
Figure 2:
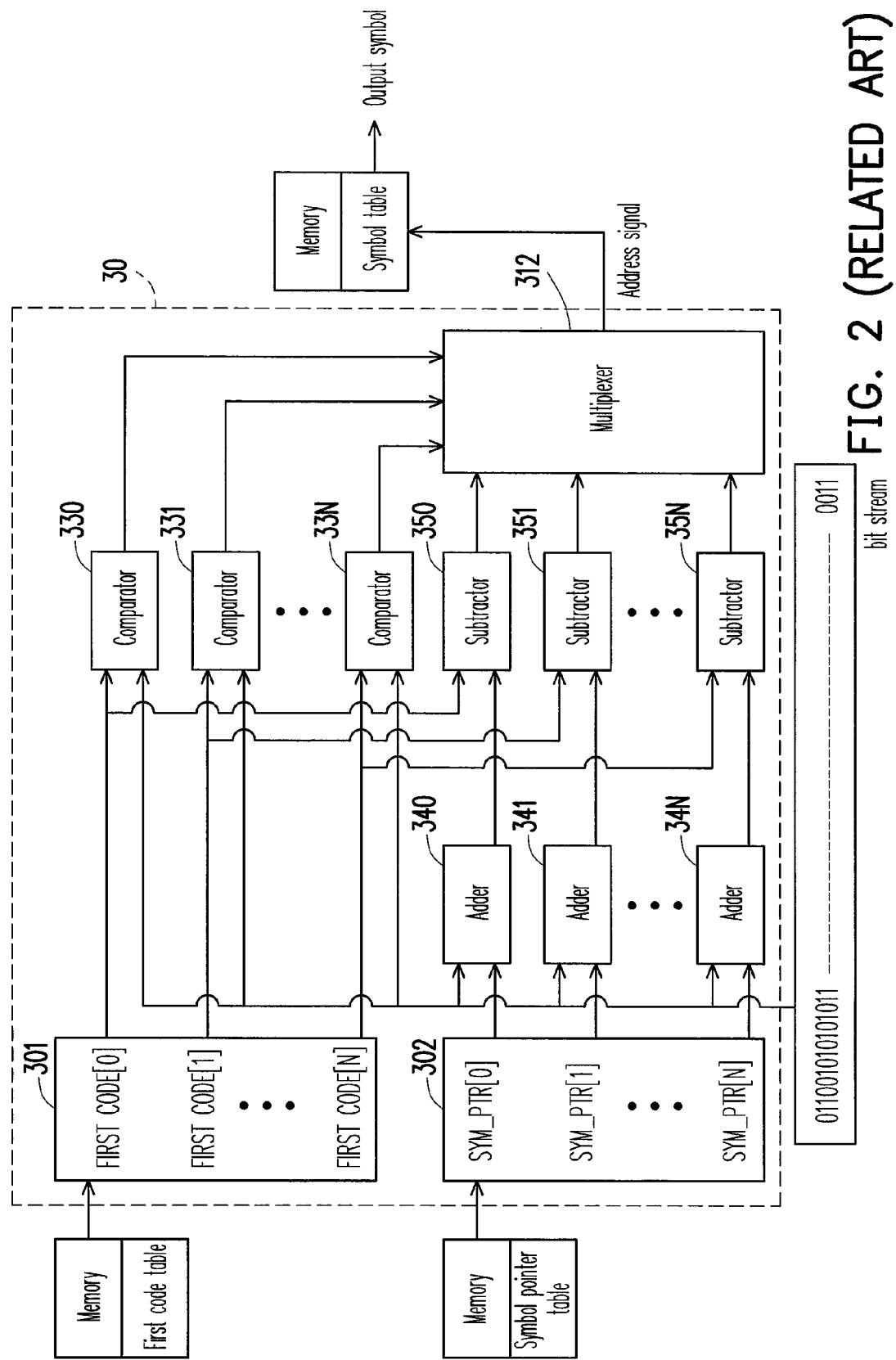
FIG. 2 is a schematic block diagram of a canonical Huffman decoder 30 according to U.S. Pat. No. 6,657,569.

Reference will now be made in detail to the exemplary embodiments of the invention, the exemplary embodiments of which are illustrated in the accompanying drawings. Wherever possible, the same reference numbers are used in the drawings and the description to refer to the same or like parts.

The first type of canonical Huffman coding and the second type of canonical Huffman coding will be explained herein before describing the adaptive canonical Huffman decoder, adaptive canonical Huffman decoding method, and video decoder provided by exemplary embodiments of the present invention.

The first type of canonical Huffman coding has two extra assumptions besides the assumption of numerical sequence property. The first assumption specifies that the coding is started from the first symbol having the smallest codeword length and the value of the codeword has to be 0. The second assumption is adopted to fully utilize the coding space, and the second assumption specifies that a first code having a codeword length of L can be obtained from a last code having a codeword length of L−n, wherein those codewords having their codeword lengths of L−1, L−2, . . . , and L−n+1 do not exist in the Huffman coding tree, and n is an integer between 1 and L−1.

Assuming the codeword having a codeword length of L−1 exists in the Huffman coding tree, the first code having a codeword length of L is obtained by adding 1 to the last code having a codeword length of L−1 and then shifting the result leftwards for one bit. Herein the first code having a codeword length of L can be expressed as:

$$\text{FIRSTCODE}[L]=(\text{LASTCODE}[L-1]+1)<<1,$$

wherein FIRSTCODE[L] represents the first code having a codeword length of L, LASTCODE[L−1] represents the last code having a codeword length of L−1, and "<<1" represents the operator for shifting the code leftwards for one bit.

Assuming the codewords having the codeword lengths of L−1, L−2, . . . , and L−n+1 do not exist in the Huffman coding tree and the codeword having a codeword length of L−n exists in the Huffman coding tree, the first code having a codeword length of L is obtained by adding 1 to the last code having a codeword length of L−n and then shifting the addition result rightwards for n bits. Herein the first code having a codeword length of L can be expressed as:

$$\text{FIRSTCODE}[L]=(\text{LASTCODE}[L-n]+1)<<n,$$

wherein FIRSTCODE[L] represents the first code having a codeword length of L, LASTCODE[L−n] represents the last code having a codeword length of L−n, and "<<n" represents the operator for shifting the code leftwards for n bits.

The major difference between the second type of canonical Huffman coding and the first type of canonical Huffman coding is that where the encoding is started. Besides the assumption of numerical sequence property, the second type of canonical Huffman coding has another two other assumptions. The first assumption specifies that the encoding is started from the first symbol having the largest codeword length and the value of the codeword has to be 0. The second assumption is adopted to fully utilize the encoding space, and which specifies that a first code having a codeword length of L can be obtained from a last code having a codeword length of L+n, wherein the codewords having the codeword lengths of L+1, L+2, . . . , and L+n−1 do not exist in the Huffman coding tree, and n is a natural number.

Assuming the codeword having a codeword length of L+1 exists in the Huffman coding tree, the first code having a codeword length of L is obtained by shifting the last code having a codeword length of L+1 rightwards for one bit and then increasing the result by 1. Herein, the first code having a codeword length of L can be expressed as:

$$\text{FIRSTCODE}[L]=(\text{LASTCODE}[L+1]>>1)+1,$$

wherein FIRSTCODE[L] represents the first code having a codeword length of L, LASTCODE[L+1] represents the last code having a codeword length of L+1, and ">>1" represents the operator for shifting the code rightwards for one bit.

Assuming the codewords having the codeword lengths of L+1, L+2, . . . , and L+n−1 do not exist in the Huffman coding tree and the codeword having a codeword length of L+n exists in the Huffman coding tree, the first code having a codeword length of L is obtained by shifting the last code having a codeword length of L+n rightwards for n bits and then increasing the result by 1. Herein the first code having a codeword length of L can be expressed as:

$$\text{FIRSTCODE}[L]=(\text{LASTCODE}[L+n]>>n)+1,$$

wherein FIRSTCODE[L] represents the first code having a codeword length of L, LASTCODE[L+n] represents the last code having a codeword length of L+n, and ">>n" represents the operator for shifting the code rightwards for n bits.

Figure 3:
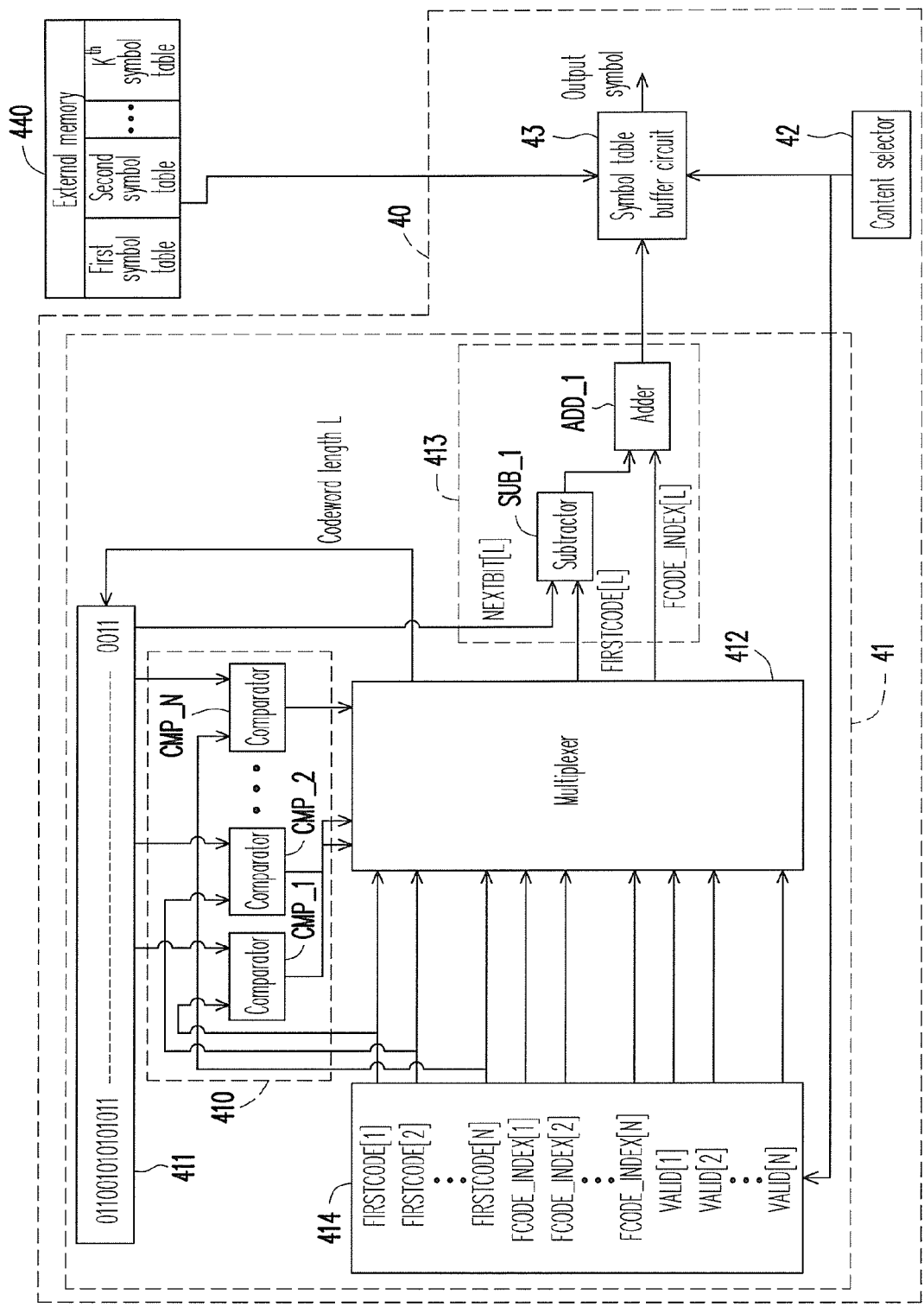
FIG. 3 is a schematic block diagram of an adaptive canonical Huffman decoder 40 according to an exemplary embodiment of the present invention.

FIG. 3 is a schematic block diagram of an adaptive canonical Huffman decoder 40 according to an exemplary embodiment of the present invention. Referring to FIG. 3, the adaptive canonical Huffman decoder 40 includes a symbol index generator 41, a content selector 42, and a symbol table buffer circuit 43. The content selector 42 is coupled to the symbol index generator 41, and the symbol table buffer circuit 43 is coupled to the symbol index generator 41 and the content selector 42.

The content selector 42 determines a content selection signal according to a quantization parameter (QP), an inter-frame difference, or an intra-frame difference and outputs the content selection signal to the symbol index generator 41 and the symbol table buffer circuit 43. After the symbol index generator 41 receives the content selection signal, it selects a corresponding decoding information from the decoding information of a plurality of encoding tables stored therein according to the content selection signal, wherein the corresponding decoding information is corresponding to the encoding table used for encoding a bit stream. Meanwhile, the symbol table buffer circuit 43 reads a corresponding symbol table among a plurality of symbol tables stored in an external memory 440 according to the content selection signal and stores the corresponding symbol table. For example, if the corresponding symbol table read by the symbol table buffer circuit 43 according to the content selection signal is a second symbol table, the symbol table buffer circuit 43 stores the second symbol table.

In the present exemplary embodiment, the decoding information corresponding to the selected encoding table includes N first codes FIRSTCODE[1]~FIRSTCODE[N] having their codeword lengths from 1 to N, N first code indexes FCODE_INDX[1]~FCODE_INDEX[N], and N recognition signals VALID[1]~VALID[N], wherein the N recognition signals VALID[1]~VALID[N] respectively indicate whether the N first codes FIRSTCODE[1]~FIRSTCODE[N] having their codeword lengths from 1 to N exist, and the N first code indexes FCODE_INDX[1]~FCODE_INDEX[N] are respectively the indexes of the N first codes FIRSTCODE[1]~FIRSTCODE[N].

After the symbol index generator 41 selects the corresponding decoding information and the symbol table buffer circuit 43 stores the corresponding symbol table, the symbol index generator 41 receives a bit stream and decodes the bit stream according to the corresponding decoding information to obtain a symbol index SYMBOL_INDEX. After that, the symbol table buffer circuit 43 obtains an output symbol from the corresponding symbol table according to the symbol index SYMBOL_INDEX.

It should be noted that because of the assumption of numerical sequence property and the other assumptions of the first type or second type of canonical Huffman coding, the symbol index generator 41 needs not to store all the information of each encoding table. Instead, the symbol index generator 41 needs only to store the decoding information of each encoding table. Each of a plurality of symbol tables stored in the external memory 440 stores a plurality of symbols and a plurality of corresponding indexes. Thus, the symbol table buffer circuit 43 can find the corresponding output symbol from the corresponding symbol table stored therein according to the symbol index SYMBOL_INDEX. The symbol table buffer circuit 43 is substantially a lookup table which can be updated according to the content selection signal.

Next, the structure of the symbol index generator 41 will be described in detail. The symbol index generator 41 includes a comparator circuit 410, a bit stream register 411, a multiplexer 412, a symbol index calculation circuit 413, and a decoding information generator 414. The bit stream register 411 is coupled to the comparator circuit 410, the multiplexer 412, and the symbol index calculation circuit 413, the decoding information generator 414 is coupled to the content selector 42 and the multiplexer 412, and the multiplexer is coupled to the comparator circuit 410.

The bit stream register 411 temporarily stores a bit stream and outputs the first to the $N^{th}$ bit of the bit stream to the comparator circuit 410. After the multiplexer 412 determines the codeword length L of the bit stream, the multiplexer 412 notifies the bit stream register 411 to output a codeword NEXTBIT[L] constructed by the first to the $L^{th}$ bit of the bit stream to the symbol index calculation circuit 413. It should be noted that after the multiplexer 412 notifies the bit stream register 411 to output the codeword NEXTBIT[L] constructed by the first to the $L^{th}$ bit of the bit stream to the symbol index calculation circuit 413, the multiplexer 412 shifts the bit stream temporarily stored therein for L bits to wait for a next decoding process. In other words, the codeword NEXTBIT[L] output this time does not exist in the bit stream register 411 anymore.

The decoding information generator 414 stores the decoding information of a plurality of encoding tables and selects a corresponding decoding information from the decoding information of the encoding tables according to a content selection signal. The corresponding decoding information selected by the decoding information generator 414 includes N first codes FIRSTCODE[1]~FIRSTCODE[N] having their codeword lengths from 1 to N, N first code indexes FCODE_INDX[1]~FCODE_INDEX[N], and N recognition signals VALID[1]~VALID[N]. The decoding information generator 414 provides the selected corresponding decoding information to the multiplexer 412.

The comparator circuit 410 has N comparators CMP_1~CMP_N of 1 to N bits, and the comparator circuit 410 compares the bit stream with the N first codes FIRSTCODE[1]~FIRSTCODE[N] to generate N selection signals, wherein N is greater than or equal to 2. The comparator CMP_1 compares a codeword constructed by the first bit in the bit stream with the first code FIRSTCODE[1] having a codeword length of 1 and outputs a selection signal to the multiplexer 412. The comparator CMP_N compares a codeword constructed by the first to the $N^{th}$ bits in the bit stream with the first code FIRSTCODE[N] having a codeword length of N and outputs a selection signal to the multiplexer 412. The other comparators CMP_2~CMP_N−1 operate in a similar way and will not be described herein.

In the present exemplary embodiment, the N selection signals are substantially signals of 0 or 1. The N selection signals represent foregoing comparison results, and the multiplexer 412 determines the codeword length L according to the N selection signals. The multiplexer 412 selects the first code FIRSTCODE[L] having a codeword length of L among the N first codes FIRSTCODE[1]~FIRSTCODE[N] and the first code index FCODE_INDEX[L] of the first code FIRSTCODE[L] having a codeword length of L among the N first code indexes FCODE_INDEX[1]~FCODE_INDEX[N] according to the N selection signals and the N recognition signals VALID[1]~VALID[N], wherein L is a natural number smaller than or equal to N.

It should be noted that in some coding cases, codewords of some specific lengths do not exist. In this case, the selection signals output by some of the comparators are meaningless but may affect the decoding result. Thus, the decoding information generator 414 generates N recognition signals VALID[1]~VALID[N]. For example, if there is no codeword having the codeword length 3 or 5 in an encoding table, the recognition signals VALID[3] and VALID[5] are equal to 1, and the other recognition signals are equal to 0. With these recognition signals VALID[1]~VALID[N], the multiplexer 412 determines the codeword length L according to the selection signals generated by the comparators CMP_1~CMP_N and the recognition signals VALID[1]~VALID[N]. If the recognition signal VALID[i] is equal to 1, the multiplexer 412 ignores the selection signal output by the comparator CMP_i and determines that the codeword length of the codeword is not i.

The symbol index calculation circuit 413 calculates the symbol index SYMBOL_INDEX according to the first code index FCODE_INDEX[L] having a codeword length of L, the first code FIRSTCODE[L] having a codeword length of L, and a codeword NEXTBIT[L] constructed by L bits in the bit stream. It should be noted that regardless of whether the first type or second type of canonical Huffman coding is adopted, while decoding a code, the symbol index SYMBOL_INDEX is always equal to the sum of the first code index FCODE_INDEX[L] and the codeword NEXTBIT[L] minus the first code FIRSTCODE[L], and herein the calculation formula of the symbol index SYMBOL_INDEX is expressed as:

SYMBOL_INDEX=NEXTBIT[*L*]+FCODE_INDEX [*L*]−FIRSTCODE[*L*].

Thus, the symbol index calculation circuit 413 includes a subtractor SUB_1 and an adder ADD_1. The subtractor SUB_1 subtracts the first code FIRSTCODE[L] from the codeword NEXTBIT[L], and the adder ADD_1 adds the first code index FCODE_INDEX[L] to the output of the subtractor SUB_1. However, the implementation of the symbol index calculation circuit 413 described above is only an exemplary example of the present invention but not intended for limiting the present invention, and those having ordinary knowledge in the art should be able to implement the symbol index calculation circuit 413 through other methods or revise the symbol index calculation circuit 413 illustrated in FIG. 3 appropriately based on foregoing conclusion of the calculation formula of the symbol index SYMBOL_INDEX (i.e. SYMBOL_INDEX=NEXTBIT[L]+FCODE_INDEX[L]−FIRSTCODE[L]).

The following Table 1 is an encoding table of a plurality of symbols by using the first type of canonical Huffman coding, and the following Table 2 represents the decoding information to be stored corresponding to the encoding table in Table 1, wherein the first code FIRSTCODE[L] having a codeword length of L in the Table 2 is in decimal values. Besides, even though the first code FIRSTCODE[1] having a codeword of 1 does not exist in the Huffman coding tree, the first code FIRSTCODE[1] having a codeword length of 1 can be set to 0 and the corresponding first code index FCODE_INDEX[1] can be set to 0 because of the indication of the recognition signal VALID[1].

Herein, Tables 1 and 2 are illustrated as follows.

TABLE 1

| | Symbol Index | | | | | | | | | | |
|---|---|---|---|---|---|---|---|---|---|---|---|
| | 0 | 1 | 2 | 3 | 4 | 5 | 6 | 7 | 8 | 9 | 10 |
| Codeword Length | 2 | 3 | 3 | 3 | 4 | 4 | 4 | 4 | 4 | 5 | 5 |
| Codeword | 00 | 010 | 011 | 100 | 1010 | 1011 | 1100 | 1101 | 1110 | 11110 | 11111 |
| Symbol | A | B | c | d | E | f | g | h | i | j | k |

TABLE 2

| | Codeword Length(L) | | | | |
|---|---|---|---|---|---|
| | 1 | 2 | 3 | 4 | 5 |
| FIRSTCODE[L] | 0 | 0 | 2 | 10 | 30 |
| FCODE_INDEX[L] | 0 | 0 | 1 | 4 | 9 |
| VALID[L] | 1 | 0 | 0 | 0 | 0 |

Herein, an encoding table using the first type of canonical Huffman coding will be taken as an example for describing how the adaptive canonical Huffman decoder 40 decodes a bit stream. It is assumed that the comparator circuit 410 in the adaptive canonical Huffman decoder 40 has five comparators of 1 to 5 bits, the content selection signal indicates that the symbol table stored in the symbol table buffer circuit 43 contains all the symbols in Table 1 and the symbol index, and the corresponding decoding information selected by the decoding information generator 414 includes the first codes FIRSTCODE[1]~FIRSTCODE[5] in Table 2, the first code indexes FCODE_INDEX[1]~FCODE_INDEX[5], and five recognition signals VALID[1]~VALID[5], wherein the recognition signals VALID[2]~VALID[5] are 0 and which indicate that the first codes FIRSTCODE[2]~FIRSTCODE[5] having their codeword lengths between 2 and 5 are stored in the Huffman coding tree, and the recognition signal VALID[1] is 1 and which indicate that the first code FIRSTCODE[1] having a codeword length of 1 does not exist in the Huffman coding tree.

If the received bit stream is {001001101}, the comparator circuit 410 receives the first five bits {01101} in the bit stream and outputs five selection signals to the multiplexer 412. The comparator CMP_1 compares the first code FIRSTCODE[1] with the first bit {1} in the bit stream and outputs a selection signal, wherein the selection signal is 1. The comparator CMP_2 compares the first code FIRSTCODE[2] with the first two bits {01} in the bit stream and outputs a selection signal, wherein the selection signal is 1. The comparator CMP_3 compares the first code FIRSTCODE[3] with the first three bits {101} in the bit stream and outputs a selection signal, wherein the selection signal is 1. The comparator CMP_4 compares the first code FIRSTCODE[4] with the first four bits {1101} in the bit stream and outputs a selection signal, wherein the selection signal is 1. The comparator CMP_5 compares the first code FIRSTCODE[5] with the first five bits {01101} in the bit stream and outputs a selection signal, wherein the selection signals is 0.

The multiplexer 412 can get to know that the codeword length of the symbol to be decoded is 4 according to the five selection signals output by the comparator circuit 410. Since the recognition signal VAILD[4] is 0 and the codeword length of the symbol to be decoded is 4, the multiplexer 412 selects the first code FIRSTCODE[4] and the first code index FCODE_INDEX[4] as its outputs. Then, the symbol index calculation circuit 413 calculates the symbol index SYMBOL_INDEX according to the first code FIRSTCODE[4], the first code index FCODE_INDEX[4], and the codeword NEXTBIT[4] constructed by the first four bits in the received bit stream.

Herein the decimal value of the codeword NEXTBIT[4] is 13, and the first code FIRSTCODE[4] and first code index FCODE_INDEX[4] are respectively 10 and 4. Thus, the symbol index SYMBOL_INDEX=13+4−10=7. Next, the symbol table buffer circuit 43 finds an output symbol from the corresponding symbol table stored therein according to the symbol index SYMBOL_INDEX for decoding the first four bits in the bit stream. In the present exemplary embodiment, when the symbol index SYMBOL_INDEX is 7, the output symbol is h (referring to Table 1).

After the first four bits {1101} in the bit stream is decoded, these four bits {1101} do not exist in the bit stream register 411 anymore. Thus, the remaining bit stream contains only five bits {00100}. Thereafter, the adaptive canonical Huffman decoder 40 decodes the last five bits {00100}, and how the adaptive canonical Huffman decoder 40 decodes the five bits {00100} can be understood from foregoing description therefore will not be described herein.

The following Table 3 is an encoding table of a plurality of symbols which use the second type of canonical Huffman coding, and the following Table 4 shows the decoding information to be stored corresponding to the encoding table in Table 3, wherein the first code FIRSTCODE[L] in Table 4 which has a codeword length of L is represented by a decimal value. In addition, even though the first code FIRSTCODE[1] having its codeword as 1 does not exist in the Huffman coding tree, with the indication of the recognition signal VALID[1], the first code FIRSTCODE[1] having a codeword length of 1 can be set to 2, and the corresponding first code index FCODE_INDEX[1] can be set to 12.

Herein Tables 3 and 4 are illustrated as follows.

TABLE 3

| | Symbol Index | | | | | | | | | | |
|---|---|---|---|---|---|---|---|---|---|---|---|
| | 0 | 1 | 2 | 3 | 4 | 5 | 6 | 7 | 8 | 9 | 10 |
| Codeword Length | 5 | 5 | 4 | 4 | 4 | 4 | 4 | 3 | 3 | 3 | 2 |
| Codeword | 00000 | 00001 | 0001 | 0010 | 0011 | 0100 | 0101 | 011 | 100 | 101 | 11 |
| Symbol | a | b | c | d | e | f | g | h | i | j | k |

TABLE 4

| | Codeword Length(L) | | | | |
|---|---|---|---|---|---|
| | 5 | 4 | 3 | 2 | 1 |
| FIRSTCODE[L] | 0 | 1 | 3 | 3 | 2 |
| FCODE_INDEX[L] | 0 | 2 | 7 | 10 | 12 |
| VALID[L] | 0 | 0 | 0 | 0 | 1 |

Below, an encoding table based on the second type of canonical Huffman coding is taken as an example for describing how the adaptive canonical Huffman decoder 40 decodes a bit stream it receives. It is assumed that the comparator circuit 410 in the adaptive canonical Huffman decoder 40 has five comparators of 1 to 5 bits, the content selection signal indicates that the symbol table stored in the symbol table buffer circuit 43 includes all the symbols in Table 3 and the symbol index, and the corresponding decoding information selected by the decoding information generator 414 includes the first codes FIRSTCODE[1]~FIRSTCODE[5], the first code indexes FCODE_INDEX[1]~FCODE_INDEX[5], and five recognition signals VALID[1]~VALID[5] in Table 4, wherein the recognition signals VALID[2]~VALID[5] are 0 and which indicate that the first codes FIRSTCODE[2]~FIRSTCODE[5] having their codeword lengths between 2 and 5 exist in the Huffman coding tree, and the recognition signal VALID[1] is 1 and which indicates that the first code FIRSTCODE[1] having a codeword length of 1 does not exist in the Huffman coding tree.

If the received bit stream is {1101100001}, the comparator circuit 410 receives the first five bits {00001} in the bit stream and outputs five selection signals to the multiplexer 412. The comparator CMP_1 compares the first code FIRSTCODE[1] with the first bit {1} in the bit stream and outputs a selection signal, wherein the selection signal is 0. The comparator CMP_2 compares the first code FIRSTCODE[2] with the first two bits {01} in the bit stream and outputs a selection signal, wherein the selection signal is 0. The comparator CMP_3 compares the first code FIRSTCODE[3] with the first three bits {001} in the bit stream and outputs a selection signal, wherein the selection signal is 0. The comparator CMP_4 compares the first code FIRSTCODE[4] with the first four bits {0001} in the bit stream and outputs a selection signal, wherein the selection signal is 0. The comparator CMP_5 compares the first code FIRSTCODE[5] with the first five bits {00001} in the bit stream and outputs a selection signal, wherein the selection signal is 1.

The multiplexer 412 can understand that the symbol to be decoded has a codeword length of 5 according to the five selection signals output by the comparator circuit 410. Since the recognition signal VAILD[5] is 0, and the multiplexer 412 knows the codeword length of the symbol to be decoded is 5, the multiplexer 412 selects the first code FIRSTCODE[5] and the first code index FCODE_INDEX[5] as its outputs. Then, the symbol index calculation circuit 413 calculates the symbol index SYMBOL_INDEX according to the first code FIRSTCODE[5], the first code index FCODE_INDEX[5], and the codeword NEXTBIT[5] constructed by the first five bits in the received bit stream.

Herein, the decimal value of the codeword NEXTBIT[5] is 1, and the first code FIRSTCODE[5] and the first code index FCODE_INDEX[5] are both 0. Thus, the symbol index SYMBOL_INDEX=1+0−0=1. Next, the symbol table buffer circuit 43 finds an output symbol from the corresponding symbol table stored therein according to the symbol index SYMBOL_INDEX, so as to decode the first four bits in the bit stream. In the present exemplary embodiment, when the symbol index SYMBOL_INDEX is 1, the output symbol is b (referring to Table 3).

After the first five bits {00001} in the bit stream is decoded, these five bits {00001} do not exist in the bit stream register 411 anymore. Thus, the remaining bit stream contains only five bits {11011}. Thereafter, the adaptive canonical Huffman decoder 40 decodes these remaining five bits {11011}, and how the adaptive canonical Huffman decoder 40 decodes the five bits {11011} can be understood from foregoing description therefore will not be described herein.

As described above, the adaptive canonical Huffman decoder 40 in the present exemplary embodiment is adaptable and can be used for decoding a bit stream of the first type or second type of canonical Huffman coding. In addition, all the symbol tables are saved in the external memory 440, and the symbol table buffer circuit 43 can read a corresponding symbol table from the external memory 440 according to a content selection signal. Thus, the hardware cost of the adaptive canonical Huffman decoder 40 is greatly reduced, and the speed thereof can meet the requirements of general real-time systems.

Figure 4:
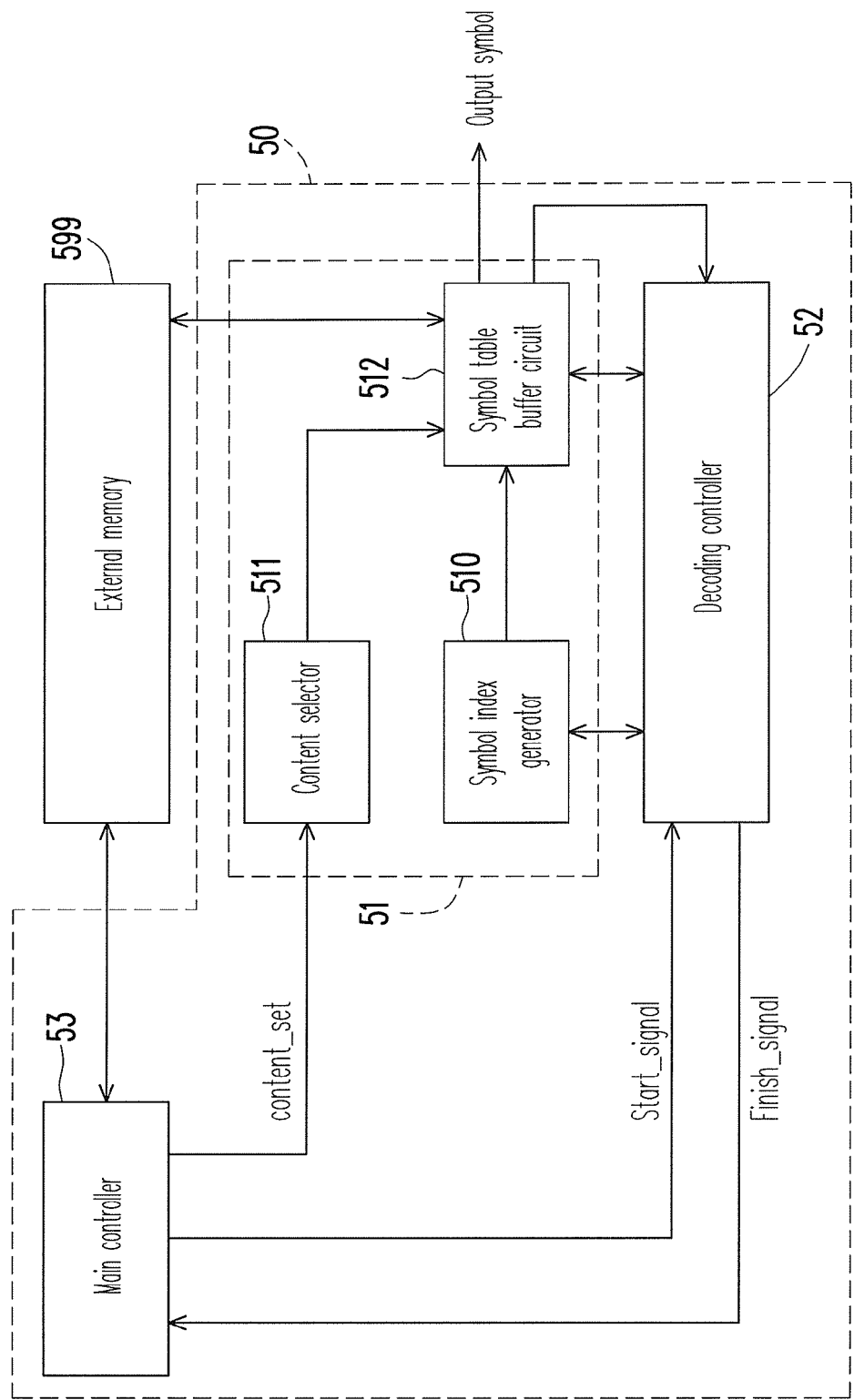
FIG. 4 is a schematic block diagram of a video decoder 50 according to an exemplary embodiment of the present invention.

FIG. 4 is a schematic block diagram of a video decoder 50 according to an exemplary embodiment of the present invention. Referring to FIG. 4, the video decoder 50 includes an adaptive canonical Huffman decoder 51, a decoding controller 52, and a main controller 53. The adaptive canonical Huffman decoder 51 is coupled to the decoding controller 52 and the main controller 53, and the main controller 53 is coupled to the decoding controller 52. The adaptive canonical Huffman decoder 51 includes a symbol index generator 510, a content selector 511, and a symbol table buffer circuit 512. The content selector 511 is coupled to the main controller 53, the symbol index generator 510, and the symbol table buffer circuit 512, the symbol table buffer circuit 512 is coupled to an external memory 599, the decoding controller 52, and the symbol index generator 510, and the symbol index generator 510 is coupled to the decoding controller 52.

The decoding controller 52 is coupled to the symbol index generator 510 and the symbol table buffer circuit 512. The decoding controller 52 communicates with the symbol index generator 510 and the symbol table buffer circuit 512 through some control signals, so as to confirm the states of each other and instruct the operations of the symbol index generator 510 and the symbol table buffer circuit 512. The main controller 53 reads a header from the external memory 599 and decodes the header to obtain an initial signal Content_set and a start signal Start_set. In addition, the main controller 53 further receives an end signal Finish_signal from the decoding controller 52. The header may be a header of the bit stream to be decoded, and the header may be the first a few bits in the bit stream to be decoded or an independently transmitted header.

The function of the adaptive canonical Huffman decoder 51 is similar to that of the adaptive canonical Huffman decoder 40 in FIG. 3, and the functions of the symbol index generator 510, the content selector 511, and the symbol table buffer circuit 512 thereof are similar to those of the symbol index generator 41, the content selector 42, and the symbol table buffer circuit 43 in FIG. 3. The only difference is that the symbol index generator 510, the content selector 511, and the symbol table buffer circuit 512 in FIG. 4 are constructed in the video decoder 50. Thus, the symbol index generator 510, the content selector 511, and the symbol table buffer circuit 512 are controlled by the main controller 53 and the decoding controller 52. However, the implementations of the symbol index generator 510, the content selector 511, and the symbol table buffer circuit 512 can be referred to the implementations of the symbol index generator 41, the content selector 42, and the symbol table buffer circuit 43 in FIG. 3 except that a control circuit has to be disposed additionally.

After the main controller 53 reads the header from the external memory 599 and decodes the header, the main controller 53 respectively outputs an initial signal Content_set and a start signal Start_signal to the content selector 511 and the decoding controller 52. After the content selector 511 receives the initial signal Content_set, it generates a content selection signal for the symbol index generator 510 and the symbol table buffer circuit 512 according to the initial signal Content_set. The initial signal Content_set signal may carry a QP, an inter-frame difference, or an intra-frame difference. According to the foregoing information of the initial signal Content_set, the symbol index generator 510 can select a corresponding decoding information of a corresponding encoding table from the decoding information of a plurality of encoding tables, and the symbol table buffer circuit 512 can select a corresponding symbol table from a plurality of symbol tables stored in the external memory 599.

The adaptive canonical Huffman decoder 51 is allowed to decode the bit stream after the decoding controller 52 receives the start signal Start_signal. First, the decoding controller 52 notifies the symbol index generator 510 to select a corresponding decoding information according to the content selection signal and notifies the symbol table buffer circuit 512 to read a corresponding symbol table from the external memory 599 and stores the corresponding symbol table.

After the symbol index generator 510 selects the corresponding decoding information according to the content selection signal and the symbol table buffer circuit 512 reads the corresponding symbol table from the external memory 599 and stores the corresponding symbol table, the decoding controller 52 allows the symbol index generator 510 to start decoding the bit stream to obtain the symbol index. After that, the decoding controller 52 notifies the symbol table buffer circuit 512 to find an output symbol from the corresponding symbol table stored therein according to the symbol index.

Thereafter, the decoding controller 52 determines whether the bit stream is already decoded or whether one of the corresponding symbol table and the corresponding decoding information needs to be updated. If the bit stream is already decoded or one of the corresponding symbol table and the corresponding decoding information needs to be updated, the decoding controller 52 sends an end signal Finish_signal to the main controller 53. After the main controller 53 receives the end signal Finish_signal, the main controller 53 reads a new header from the external memory and generates new initial signal Content_set and start signal Start_signal. Then, the adaptive canonical Huffman decoder 51 starts to decode the subsequent bit stream.

Figure 5:
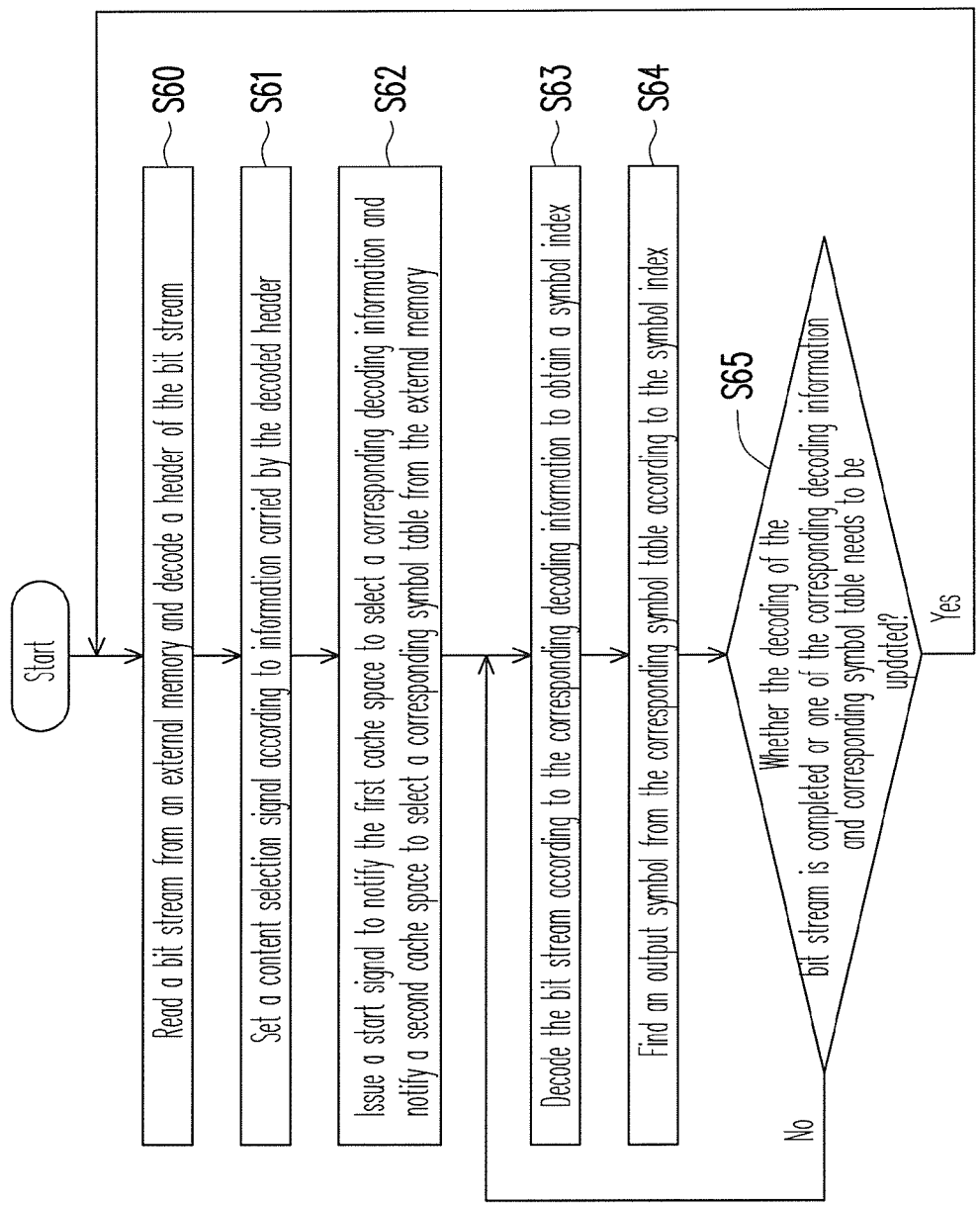
FIG. 5 is a flowchart of a video decoding method according to an exemplary embodiment of the present invention.

FIG. 5 is a flowchart of a video decoding method according to an exemplary embodiment of the present invention. The video decoding method in the present exemplary embodiment is based on the video decoder 50 illustrated in FIG. 4. However, the video decoding method in FIG. 5 is only an exemplary embodiment of the present invention but not intended for limiting the present invention.

First, in step S60, the main controller 53 receives a bit stream from the external memory 599 and decodes a header of the bit stream. Then, in step S61, the content selector 511 sets a content selection signal according to the information carried by the decoded header. Next, in step S62, the main controller 53 sends a start signal Start_signal to the decoding controller 52. The decoding controller 52 then notifies a first cache space (i.e., the decoding information generator in the symbol index generator 510) to select a corresponding decoding information and notifies a second cache space (i.e., the symbol table buffer circuit 512) to select a corresponding symbol table from the external memory 599.

Thereafter, in step S63, the decoding controller 52 notifies the symbol index generator 510 to decode the bit stream according to the corresponding decoding information to obtain a symbol index. After that, in step S64, the decoding controller 52 notifies the symbol table buffer circuit 512 to find an output symbol from the corresponding symbol table according to the symbol index. Next, in step S65, the decoding controller 52 determines whether the bit stream is already decoded or whether one of the corresponding decoding information and the corresponding symbol table needs to be updated. If the bit stream is already decoded or one of the corresponding decoding information and the corresponding symbol table needs to be updated, the decoding controller 52 sends an end signal Finish_signal to the main controller 53. After that, step S60 is executed. If the decoding of the bit stream is not yet completed, and neither of the corresponding decoding information and the corresponding symbol table needs to be updated, the process returns to step S63, and the next bits of the bit stream will be decoded by the described above manner.

Figure 6:
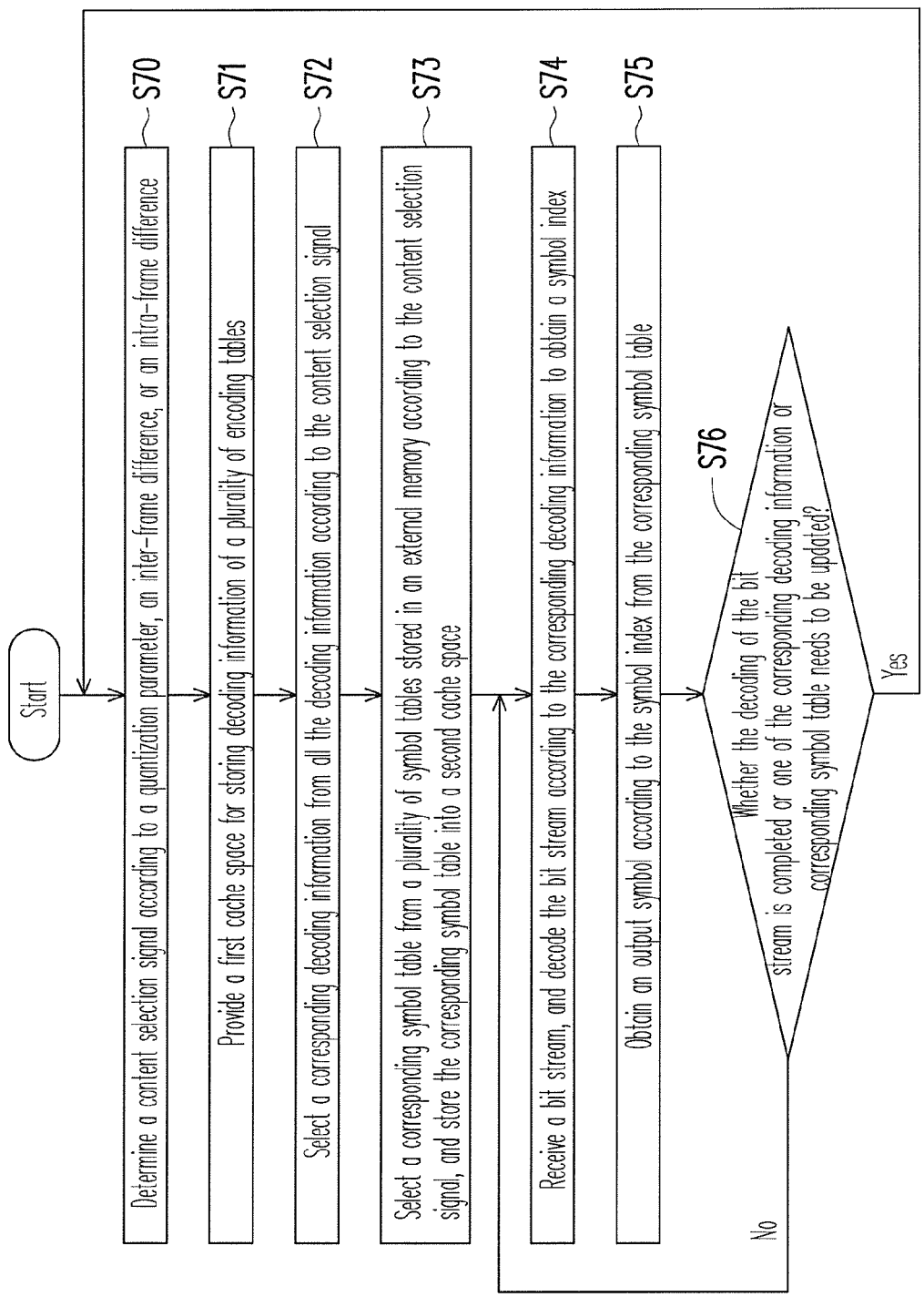
FIG. 6 is a flowchart of an adaptive canonical Huffman decoding method according to an exemplary embodiment of the present invention.

FIG. 6 is a flowchart of an adaptive canonical Huffman decoding method according to an exemplary embodiment of the present invention. The video decoding method provided by the present exemplary embodiment is based on the adaptive canonical Huffman decoder 40 in FIG. 3 and the video decoder 50 in FIG. 4. However, the video decoding method in FIG. 4 is only an exemplary embodiment of the present invention but not intended for limiting the present invention.

First, in step S70, a content selection signal is determined according to a QP, an inter-frame difference, or an intra-frame difference. Then, in step S71, a first cache space is provided for storing decoding information of a plurality of encoding tables, wherein the first cache space may be the decoding information generator 414 in FIG. 3. In step S72, a corresponding decoding information is selected from the decoding information according to the content selection signal. In other words, a corresponding encoding table is selected from a plurality of encoding tables, and the corresponding decoding information of the corresponding encoding table is stored.

In step S73, a corresponding symbol table is selected from a plurality of symbol tables stored in an external memory according to the content selection signal, and the corresponding symbol table is stored in a second cache space, wherein the second cache space may be the symbol table buffer circuit 43 illustrated in FIG. 3. Next, in step S74, a bit stream is received decoded according to the corresponding decoding information to obtain a symbol index. In step S75, an output symbol is obtained from the corresponding symbol table according to the symbol index. Thereafter, in step S76, whether the bit stream is decoded or one of the corresponding symbol table and the corresponding decoding information needs to be updated is determined. If the bit stream is decoded or one of the corresponding symbol table and the corresponding decoding information needs to be updated, the process returns to step S70. If the bit stream is not yet decoded and neither the corresponding symbol table nor the corresponding decoding information needs to be updated, the process returns to step S74.

Figure 7:
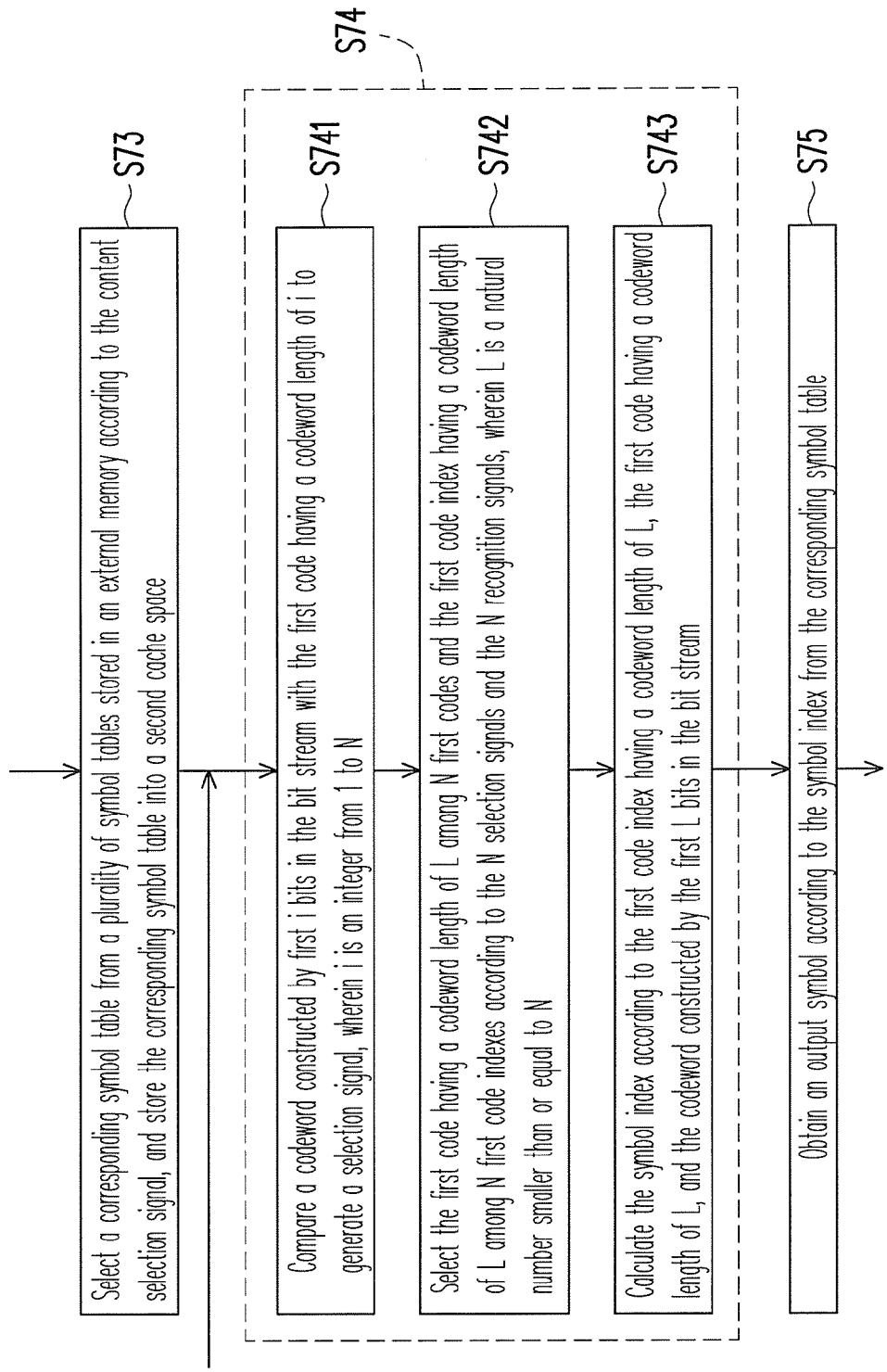
FIG. 7 is a flowchart of step S74 in FIG. 6.

FIG. 7 is a flowchart of the step S74 in FIG. 6. The step S74 in FIG. 6 can be implemented with steps S741~S743. However, the flowchart in FIG. 7 is not intended for limiting the step S74. In step S741, a codeword constructed by the first i bits in the bit stream is compared with the first code having a codeword length of i to generate a selection signal, wherein i is an integer from 1 to N. The function of step S741 is equivalent to that of the comparator circuit 410 in FIG. 3. Thus, in step S741, N selection signals are generated.

Next, in step S742, a first code having a codeword length of L is selected from the N first codes and a first code index having a codeword length of L is selected from the N first code indexes according to the N selection signals and the N recognition signals, wherein L is a natural number smaller than or equal to N. The function of step S741 is equivalent to that of the multiplexer 412 in FIG. 3. After that, in step S743, the symbol index is calculated according to the first code index having a codeword length of L, the first code having a codeword length of L, and a codeword constructed by L bits in the bit stream. The function of step S743 is equivalent to that of the symbol index calculation circuit 413 in FIG. 3. Through the detailed process illustrated in FIG. 7, the symbol index can be correctly calculated, and then a correct output symbol can be obtained according to the symbol index.

As described above, compared to the conventional adaptive canonical Huffman decoder, adaptive canonical Huffman decoding method, and video decoder, the adaptive canonical Huffman decoder, adaptive canonical Huffman decoding method, and video decoder provided by exemplary embodiments of the present invention are more adaptable and can decode a bit stream encoded through the first type or the second type of canonical Huffman coding.

Moreover, in the adaptive canonical Huffman decoder provided by the exemplary embodiments of the present invention, a corresponding decoding information and a corresponding symbol table are selected according to a content selection signal so that the decoding speed is faster than that of the conventional adaptive canonical Huffman decoder and accordingly the requirement of many real-time systems can be met.

Furthermore, in the exemplary embodiments of the present invention, a corresponding decoding information and a corresponding encoding table are selected according to a content selection signal, and the hardware cost will not be increased when the number of the encoding tables increases.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An adaptive canonical Huffman decoder, comprising:
a symbol index generator, for storing decoding information of a plurality of encoding tables and selecting a corresponding decoding information from the decoding information according to a content selection signal, and for receiving a bit stream and decoding the bit stream according to the corresponding decoding information to obtain a symbol index;
a content selector, coupled to the symbol index generator, for outputting the content selection signal; and
a symbol table buffer circuit, coupled to the symbol index generator and the content selector, for reading a corresponding symbol table among a plurality of symbol tables stored in an external memory according to the content selection signal, storing the corresponding symbol table, and obtaining an output symbol from the corresponding symbol table according to the symbol index,
wherein the corresponding decoding information comprises N first codes having codeword lengths from 1 to N, N first code indexes, and N recognition signals, wherein the N recognition signals indicate whether the N first codes having the codeword lengths from 1 to N exist, and N is greater than or equal to 2, and
wherein the symbol index generator comprises:
a comparator circuit, having N comparators of 1 to N bits, for comparing the bit stream with the N first codes to generate N selection signals;
a multiplexer, coupled to the comparator circuit, for selecting a first code having a codeword length of L among the N first codes and a first code index of the first code having a codeword length of L among the N first code indexes according to the N selection signals and the N recognition signals, wherein L is a natural number smaller than or equal to N; and
a symbol index calculation circuit, coupled to the multiplexer, for calculating the symbol index according to the first code index of the first code having the codeword length of L, the first code having the codeword length of L, and a codeword constructed by L bits in the bit stream.

2. The adaptive canonical Huffman decoder according to claim 1, wherein the symbol index generator comprises:
a decoding information generator, coupled to the content selector, for storing the decoding information of the plurality of encoding tables and selecting the corresponding decoding information from the decoding information according to the content selection signal.

3. The adaptive canonical Huffman decoder according to claim 1, wherein if the first code index of the first code having the codeword length of L is represented as FCODE_INDEX [L], the codeword constructed by the L bits in the bit stream is represented as NEXTBIT[L], and the first code having the codeword length of L is represented as FIRSTCODE[L], the symbol index is calculated by the following formula:

SYMBOL_INDEX=NEXTBIT[L]+FCODE_INDEX
[L]−FIRSTCODE[L].

4. The adaptive canonical Huffman decoder according to claim 1, wherein the content selector determines the content selection signal according to a quantization parameter (QP), an inter-frame difference, or an intra-frame difference.

5. A video decoder, comprising:
   an adaptive canonical Huffman decoder, comprising:
      a symbol index generator, for storing decoding information of a plurality of encoding tables and selecting a corresponding decoding information from the decoding information according to a content selection signal, and for receiving a bit stream and decoding the bit stream according to the corresponding decoding information to obtain a symbol index;
      a content selector, coupled to the symbol index generator, for outputting the content selection signal; and
      a symbol table buffer circuit, coupled to the symbol index generator and the content selector, for reading a corresponding symbol table among a plurality of symbol tables stored in an external memory according to the content selection signal, storing the corresponding symbol table, and obtaining an output symbol from the corresponding symbol table according to the symbol index; and
   a decoding controller, coupled to the symbol index generator and the symbol table buffer circuit, for controlling the symbol index generator and the symbol table buffer circuit,
   wherein the corresponding decoding information comprises N first codes having codeword lengths from 1 to N, N first code indexes, and N recognition signals, wherein the N recognition signals indicate whether the N first codes having the codeword lengths from 1 to N exist, and N is greater than or equal to 2,
   wherein the symbol index generator comprises:
      a comparator circuit, having N comparators of 1 to N bits, for comparing the bit stream with the N first codes to generate N selection signals;
      a multiplexer, coupled to the comparator circuit, for selecting a first code having a codeword length of L among the N first codes and a first code index of the first code having a codeword length of L among the N first code indexes according to the N selection signals and the N recognition signals, wherein L is a natural number smaller than or equal to N; and
      a symbol index calculation circuit, coupled to the multiplexer, for calculating the symbol index according to the first code index of the first code having the codeword length of L, the first code having the codeword length of L, and a codeword constructed by L bits in the bit stream.

6. The video decoder according to claim 5 further comprising:
   a main controller, coupled to the decoding controller, for reading a header from the external memory and decoding the header to obtain an initial signal;
   wherein the content selector receives the initial signal and determines the content selection signal according to the initial signal.

7. The video decoder according to claim 6, wherein the initial signal comprises a quantization parameter, an inter-frame difference, or an intra-frame difference.

8. The video decoder according to claim 6, wherein after the main controller decodes the header, the main controller further outputs a start signal to the decoding controller, and after the decoding controller receives the start signal, the decoding controller notifies the symbol index generator to select the corresponding decoding information and notifies the symbol table buffer circuit to read the corresponding symbol table from the external memory and store the corresponding symbol table.

9. The video decoder according to claim 8, wherein after the symbol index generator selects the corresponding decoding information and the symbol table buffer circuit reads the corresponding symbol table from the external memory and stores the corresponding symbol table, the decoding controller notifies the symbol index generator to start decoding the bit stream, so as to obtain the symbol index, and the decoding controller further notifies the symbol table buffer circuit to find the output symbol in the corresponding symbol table according to the symbol index.

10. The video decoder according to claim 6, wherein after the bit stream is decoded or when one of the corresponding symbol table and the corresponding decoding information needs to be updated, the decoding controller further sends an end signal to the main controller, and after the main controller receives the end signal, the main controller reads a new header from the external memory.

11. The video decoder according to claim 5, wherein the symbol index generator comprises:
   a decoding information generator, coupled to the content selector, for storing the decoding information of the plurality of encoding tables and selecting the corresponding decoding information from the decoding information according to the content selection signal.

12. The video decoder according to claim 5, wherein if the first code index of the first code having the codeword length of L is represented as FCODE_INDEX[L], the codeword constructed by the L bits in the bit stream is represented as NEXTBIT[L], and the first code having the codeword length of L is represented as FIRSTCODE[L], the symbol index is calculated by the following formula:

SYMBOL_INDEX=NEXTBIT[L]+FCODE_INDEX
[L]−FIRSTCODE[L].

13. An adaptive canonical Huffman decoding method, comprising:
   providing a first cache space for storing decoding information of a plurality of encoding tables;
   selecting a corresponding decoding information from the decoding information according to a content selection signal;
   selecting a corresponding symbol table from a plurality of symbol tables stored in an external memory according to the content selection signal, and storing the corresponding symbol table into a second cache space;
   receiving a bit stream, and decoding the bit stream according to the corresponding decoding information to obtain a symbol index; and
   obtaining an output symbol from the corresponding symbol table according to the symbol index,
   wherein the corresponding decoding information comprises N first codes having codeword lengths from 1 to N, N first code indexes, and N recognition signals, wherein the N recognition signals indicate whether the N first codes having the codeword lengths from 1 to N exist, and N is greater than or equal to 2, wherein the step of decoding the bit stream according to the corresponding decoding information to obtain the symbol index further comprises:

comparing a codeword constructed by first i bits in the bit stream with a first code having a codeword length of i to generate a selection signal, wherein i is an integer from 1 to N;

selecting the first code having the codeword length of L among the N first codes and a first code index of the first code having a codeword length of L among the N first code indexes according to N selection signals and the N recognition signals, wherein L is a natural number smaller than or equal to N; and calculating the symbol index according to the first code index of the first code having the codeword length of L, the first code having the codeword length of L, and a codeword constructed by L bits in the bit stream.

14. The adaptive canonical Huffman decoding method according to claim 13, wherein if the first code index having the codeword length of L is represented as FCODE_INDEX [L], the codeword constructed by the L bits in the bit stream is represented as NEXTBIT[L], and the first code having the codeword length of L is represented as FIRSTCODE[L], the symbol index is calculated by the following formula:

$$\text{SYMBOL\_INDEX} = \text{NEXTBIT}[L] + F\text{CODE\_INDEX}[L] - \text{FIRSTCODE}[L].$$

15. The adaptive canonical Huffman decoding method according to claim 13 further comprising:

determining the content selection signal according to a quantization parameter, an inter-frame difference, or an intra-frame difference.

16. The adaptive canonical Huffman decoding method according to claim 13, wherein the content selection signal is reset after the bit stream is decoded or when one of the corresponding symbol table and the corresponding decoding information needs to be updated.

* * * * *